(12) United States Patent
Partosa et al.

(10) Patent No.: US 8,766,461 B1
(45) Date of Patent: Jul. 1, 2014

(54) SUBSTRATE WITH BOND FINGERS

(71) Applicant: Texas Instruments Incorporated, Dallas, TX (US)

(72) Inventors: Raymond Partosa, Baguio (PH); Jesus Bajo Bautista, Baguio (PH); James Raymond Baello, Baguio (PH); Roxanna Bauzon Samson, Benguet (PH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/743,213

(22) Filed: Jan. 16, 2013

(51) Int. Cl.
  *H01L 23/48* (2006.01)
(52) U.S. Cl.
  USPC ............. 257/778; 257/E23.01; 257/E23.129; 257/E21.503; 257/E21.511
(58) Field of Classification Search
  USPC ............. 257/778, E23.01, E23.129, E21.503, 257/E21.511
  See application file for complete search history.

(56) References Cited

U.S. PATENT DOCUMENTS

2007/0252286 A1* 11/2007 Kunimoto et al. ............. 257/778
2010/0108371 A1*  5/2010 Furutani et al. ............... 174/260
2010/0252938 A1* 10/2010 Ozawa et al. .................. 257/778

* cited by examiner

*Primary Examiner* — Tan N Tran
(74) *Attorney, Agent, or Firm* — Steven A. Shaw; Wade James Brady, III; Frederick J. Telecky, Jr.

(57) ABSTRACT

A flip chip mounting board includes a substrate having a top surface and a plurality of generally parallel, longitudinally extending, laterally spaced apart bond fingers are formed on the top surface. Each of the plurality of bond fingers has a first longitudinal end portion and a second longitudinal end portion. A first strip of laterally extending solder resist material overlies the first longitudinal end portions of the bond fingers. The first strip has an edge wall with a plurality of longitudinally projecting tooth portions separated by gaps with a longitudinally extending tooth portion being aligned with every other one of the bond fingers. Adjacent bond fingers have first end portions covered by different longitudinal lengths of solder resist material.

11 Claims, 11 Drawing Sheets

SUBSTRATE WITH BOND FINGERS

BACKGROUND

During the past decade flip chip technology has emerged as a popular alternative to wire bonding for interconnecting semiconductor devices such as integrated circuit (IC) dies to substrates such as printed circuit boards, carrier substrates, interposers and other dies.

"Flip chip," is also known as "controlled collapse chip connection" or its acronym, "C4." With flip chip technology, solder balls/bumps are attached to electrical contact pads on one face of a die/chip. The flip chip dies are usually processed at the wafer level, i.e., while multiple identical dies are still part of a large "wafer." Solder balls are deposited on chip pads on the top side of the wafer. The wafer is sometimes "singulated" or "diced" (cut up into separate dies) at this point to provide a number of separate flip chip dies each having solder balls on the top face surface. The chips may then be "flipped" over to connect the solder balls to matching contact pads on the top surface of a substrate such as a printed circuit board or carrier substrate on which the flip chip is mounted. Solder ball attachment is usually provided by reflow heating.

As IC dies have become more complex, the number of solder bumps/balls on flip chips have increased dramatically. Whereas in the past the solder balls were usually provided by relatively large round solder balls attached to the chip contact pads, more recently copper pillars ("CuP's") have been used in place of the solder balls. A CuP is an elongated copper post member that is attached at one end to a contact pad on the flip chip die. The CuP extends outwardly from the die in a direction perpendicular to the face of the die. Each CuP has a generally bullet or hemisphere shaped solder piece attached to its distal end. The CuP's are bonded by this solder piece to corresponding contact pads on a substrate as by reflow heating. CuP's are capable of being positioned much more densely, i.e., at a "higher pitch," than conventional solder balls/bumps. One manner of facilitating connection of a substrate to a die having such high CuP density is to provide bond fingers, rather than conventional contact pads, on the substrate to which the flip chip is to be mounted. The bond fingers are elongated contact pads that may be positioned in close parallel relationship without any insulating material between them.

DETAILED DESCRIPTION

Figure 6:
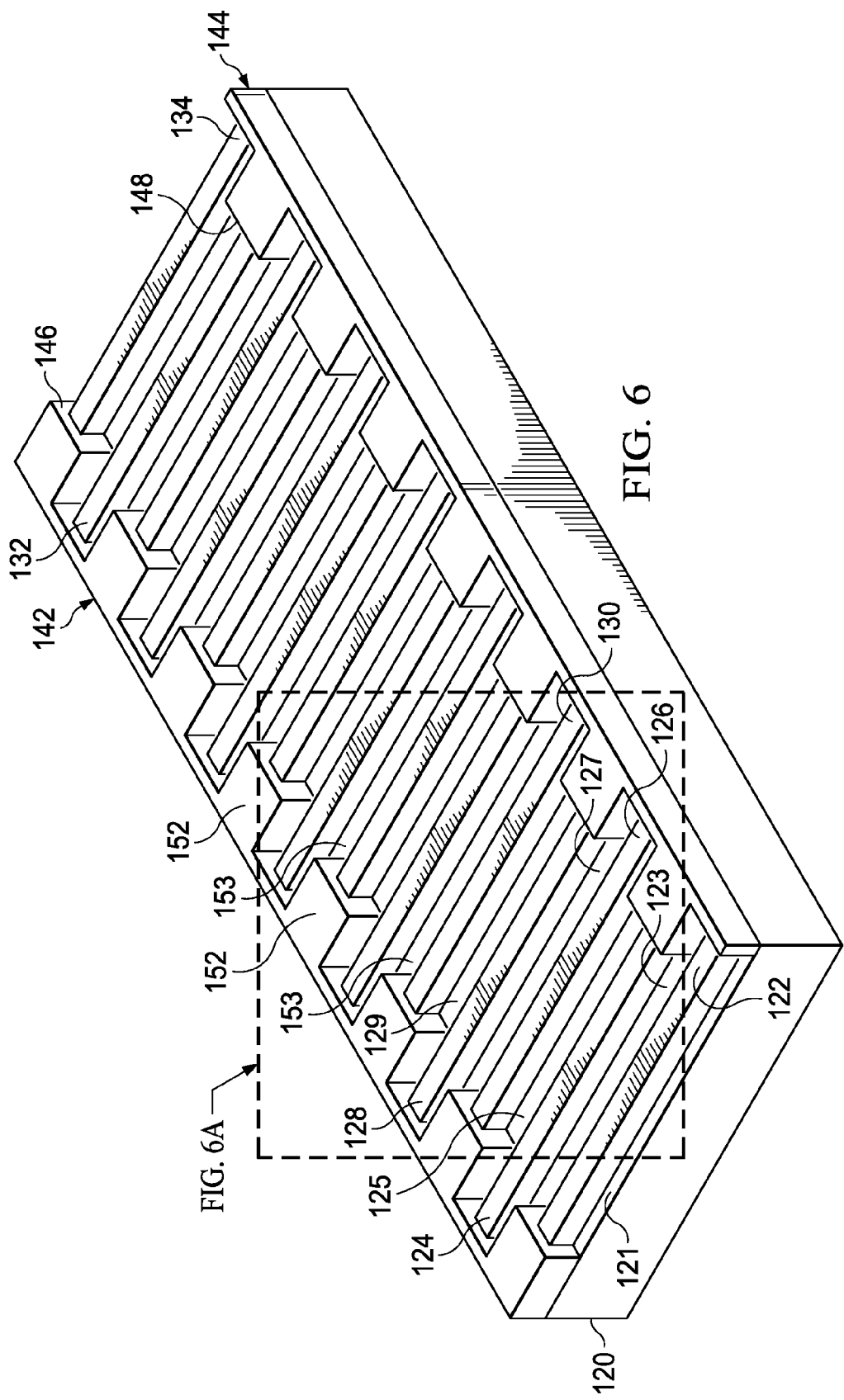
FIG. 6 is a top isometric view of one alternative to the conventional bond finger array of FIG. 5.
Figure 6A:
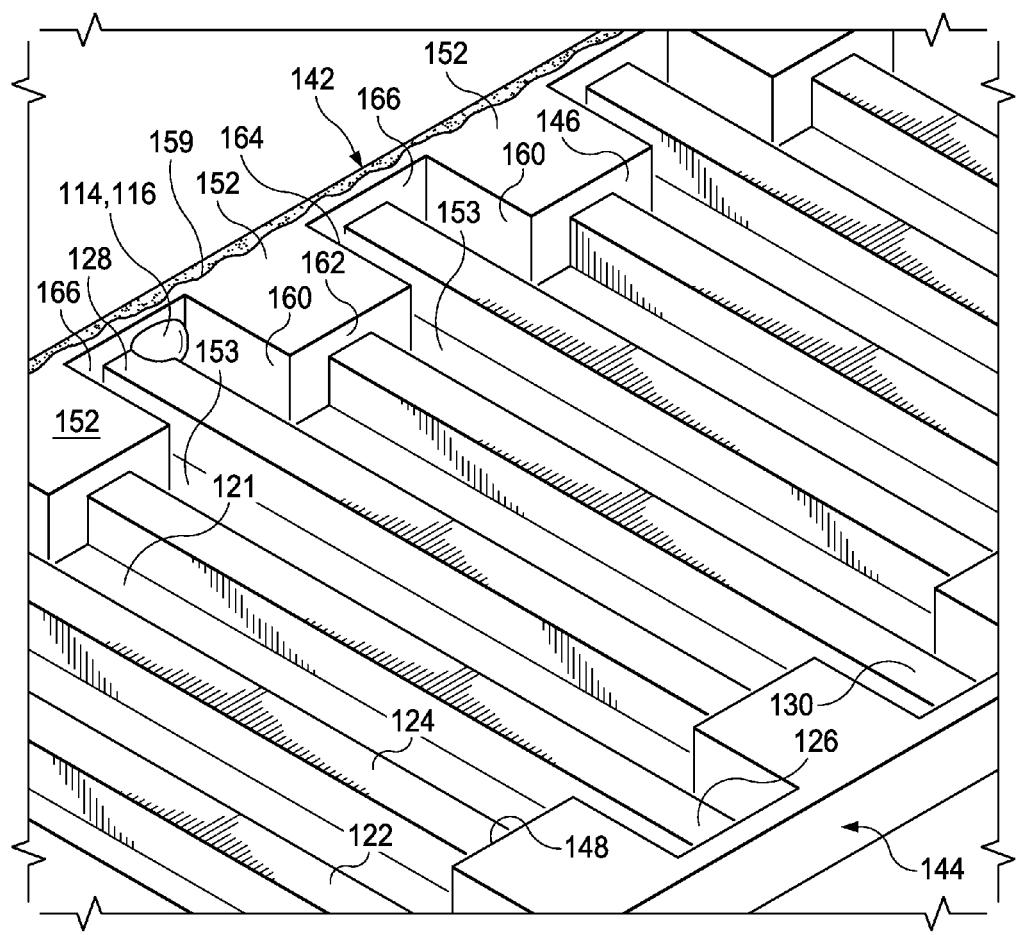
FIG. 6a is a detailed top isometric view of a portion of the bond finger array of FIG. 6 illustrating the occurrence of an NCP void in this array.

This specification, in general, discloses a flip chip mounting board that comprises a substrate 120 with a top surface 121, FIGS. 6 and 6A. A plurality of generally parallel, longitudinally extending, laterally spaced apart bond fingers 122, 124, etc., are formed on the top surface 121. Each of the plurality of bond fingers 122, 124, etc., has a first longitudinal end portion 132 and a second longitudinal end portion 134. A first strip of laterally extending solder resist material 142 overlies the first longitudinal end portions 132 of the bond fingers 122, 124, etc. The first strip of solder resist material 142 comprises an edge wall 146 that overlies the first end portions 132 of the plurality of bond fingers 122, 124, etc. The edge wall 146 has a plurality of longitudinally projecting tooth portions 152 separated by gaps 153. One of the longitudinally extending tooth portions 152 is aligned with every other bond finger 122, 128, etc. Thus, adjacent bond fingers, e.g., 122, 124, have first end portions 132 covered by different longitudinal lengths of solder resist material 142 depending upon whether they are aligned with a tooth portion 152 or a gap 153. This solder resist strip configuration solves a problem in the prior art involving nonconductive paste (NCP) bridging and solder bridging between adjacent bond fingers.

This specification also discloses a method of making a flip chip assembly. This method, in general, includes forming a plurality of laterally spaced apart, longitudinally extending bond fingers 122, 124, etc., on a surface 121 of a substrate 120. The method also includes applying a transversely extending solder resist layer or strip 142 over first end portions 132 of the plurality of bond fingers 122, 124, etc. The solder resist strip 142 if formed with an edge wall 146 including a plurality of longitudinally extending tooth portions 152 separated by gaps 153, with each tooth portion 152 and each gap 153 aligned with a different one of the bond fingers 122, 124, etc. in each adjacent pair of bond fingers, e.g. 122, 124. Having thus generally described an embodiment of a flip chip mounting board and an embodiment of a method of making a flip chip assembly, these and other embodiments will now be described in detail.

Figure 1:
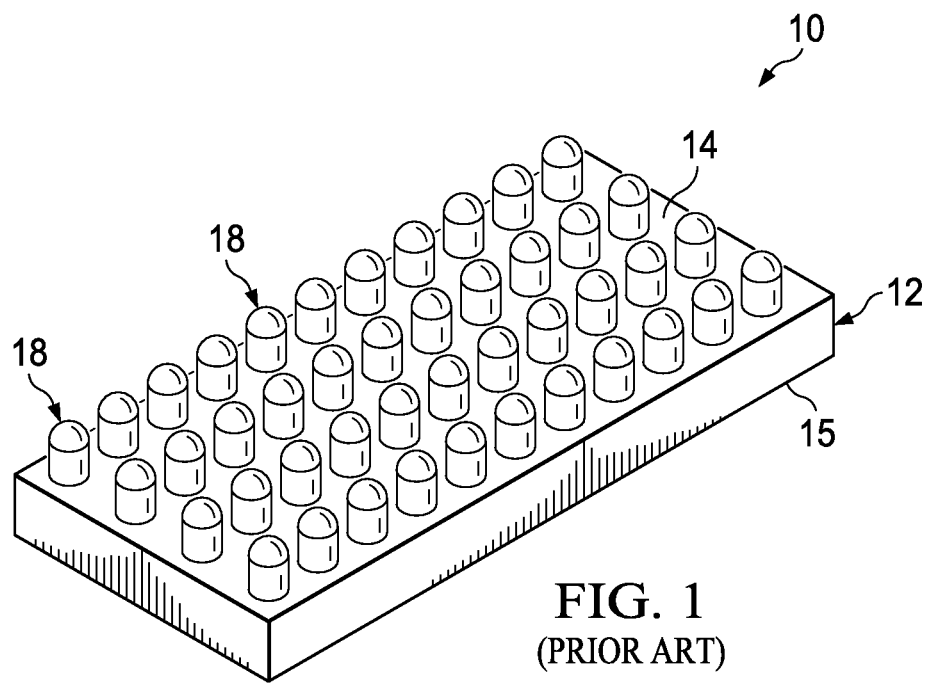
FIG. 1 is a top isometric view of a conventional flip chip die with copper post connectors.

As illustrated by FIG. 1, a conventional flip chip die 10 comprises a semiconductor substrate 12 that contains internal circuitry. The substrate has a first or active face 14 and a second or inactive face 15 opposite the first phase. An array of copper post connectors 18 project from the active face surface 14 of the die 10. The copper post array 16 includes a number of individual copper post connectors 18 which may be arranged in any desired configuration on the first face 14.

Figure 2:
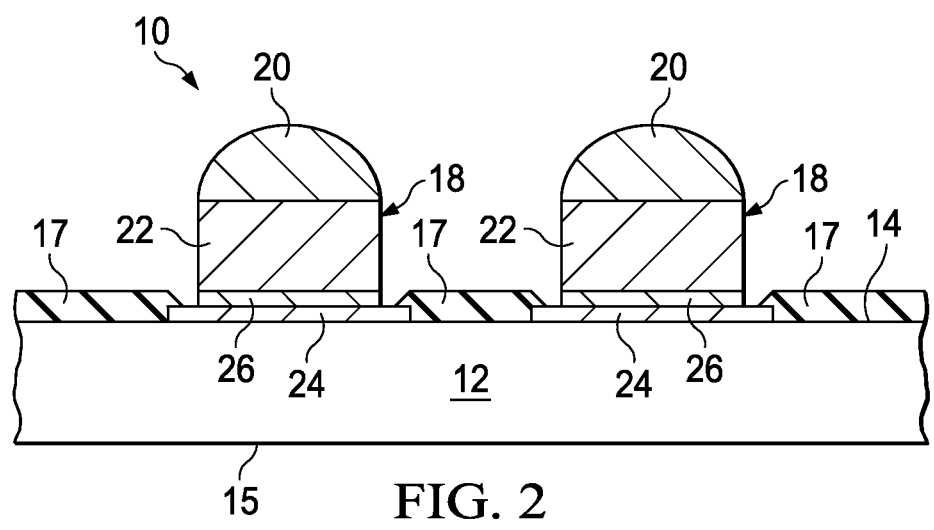
FIG. 2 is a detailed cross sectional view of a portion of the flip chip die of FIG. 1.

FIG. 2 illustrates the typical structure of a pair of conventional copper post connectors 18 projecting from the first face 14 of the die 10. Each of the individual copper post connectors 18 may comprise a generally bullet or hemisphere shaped solder tip portion 20 mounted on a generally cylindrical copper post portion 22. Each copper post portion 22 is mounted on a contact pad 24 that is formed at the top surface of the silicon substrate 12. The contact pad 24 is connected to internal circuitry (not shown) in the silicon substrate 12. The copper post portion 22 may be conventionally physically and electrically connected to the contact pad 24 as by under bump metal layer 26 in a manner well known in the art. Thus, each copper post connector 18 is electrically connected to internal circuitry in the semiconductor substrate 12 through the contact pad 24 and under bump metal layer 26. A passivation layer 17 on the top surface 14 of the die 10 encompasses each copper post connector 18.

Figure 3:
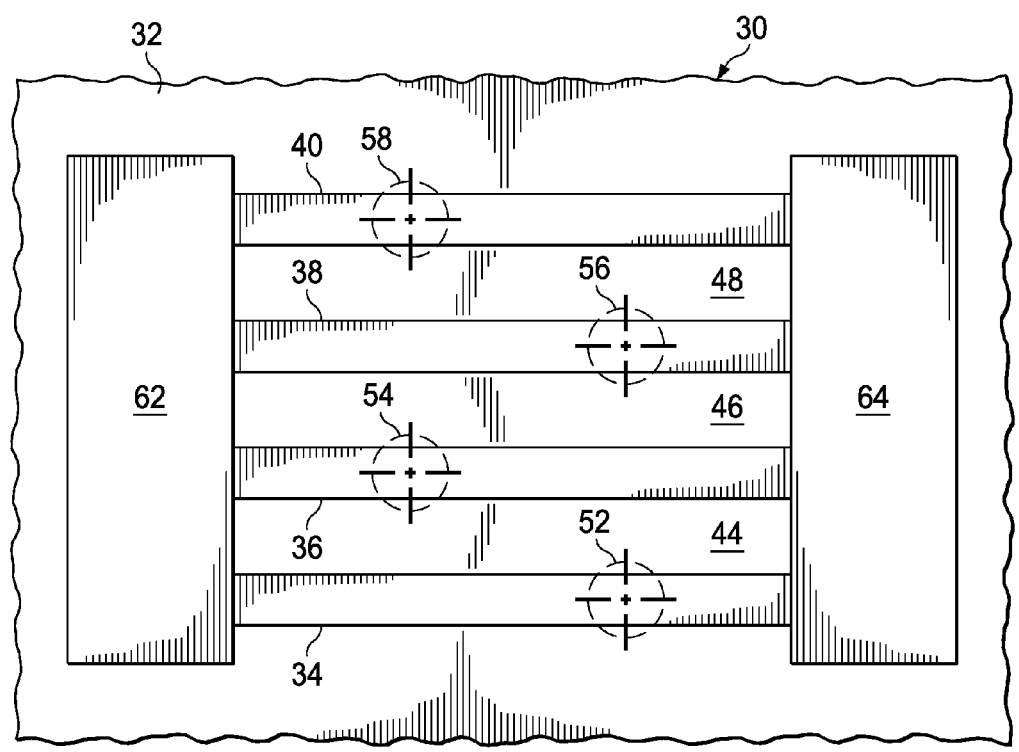
FIG. 3 is a top plan view of a portion of a conventional substrate to which the flip chip die of FIG. 1 may be connected.

FIG. 3 is a top plan view of a portion of a substrate 30 which is adapted to be connected to some of the copper post connectors ("CuP's") 18 of the flip chip die 10. The substrate 30 may be an organic substrate such as a printed circuit board, IC package carrier board, interposer, or other type of electrical connection substrate. The substrate 30 has a top surface 32 upon which a plurality of generally parallel bond fingers 34, 36, 38, 40 are provided as by conventional metal plating or other methods. The bond fingers 34, 36, 38, 40 may be made of copper or another conductive metal. The bond fingers 34, 36, 38, 40 are separated by spaces 44, 46, 48 which may all be of the same width. The bond fingers 34, 36, 38, 40 may also be of the same width. A typical width range for the bond fingers 34, etc., is 16 μm to 20 μm. The spaces 44, 46, 48 between bond fingers may have a typical width range of 40 μm to 80 μm. The ratio of the width of a bond finger to the width of the space between them is typically about 2.5 to 4. The positions at which the solder tip portions 20 of associated copper post connectors 18 are connected to individual bond fingers 34, 36, 38, 40 are illustrated by dash circles and cross hairs at 52, 54, 56, 58. Opposite longitudinal ends of the bond fingers 34, 36, etc., are covered, respectively, with strips 62, 64 of solder resist. Solder resist is a nonconductive material used to shield conductive pads and traces from solder or other conductive material. Solder resist is sometimes referred to in the art as "solder mask." A typical width (a direction parallel to the direction in which the bond fingers extend) range of a solder resist strip provided over an end portion of a bond finger is 70 μm to 170 μm.

Figure 4A:
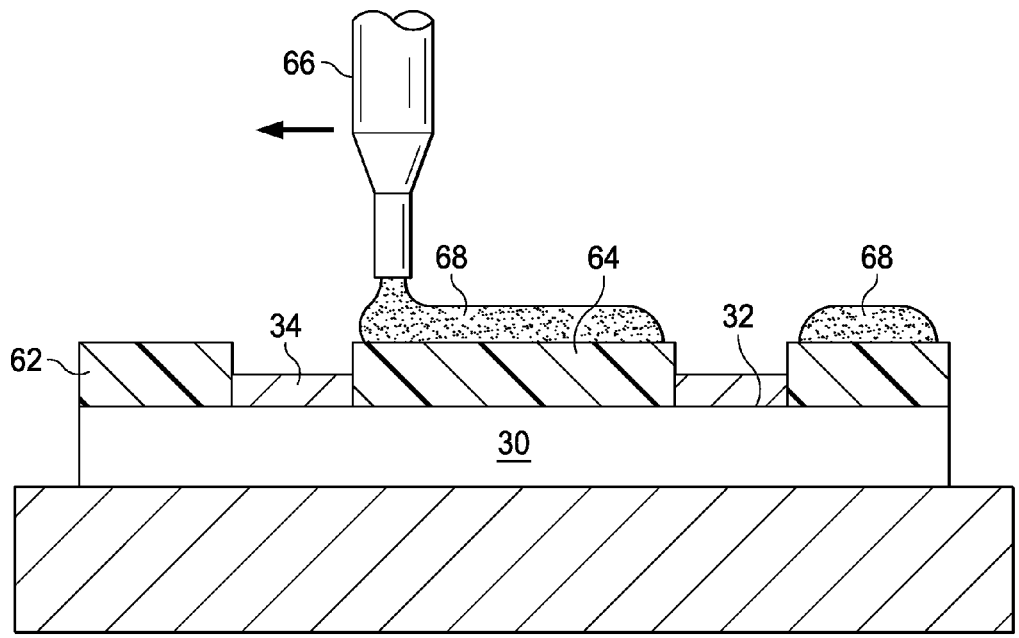
FIGS. 4a-4d are schematic representations of various stages in the process of connecting a flip chip die such as shown in FIGS. 1 and 2 to a substrate such as shown in FIG. 3.
Figure 4B:
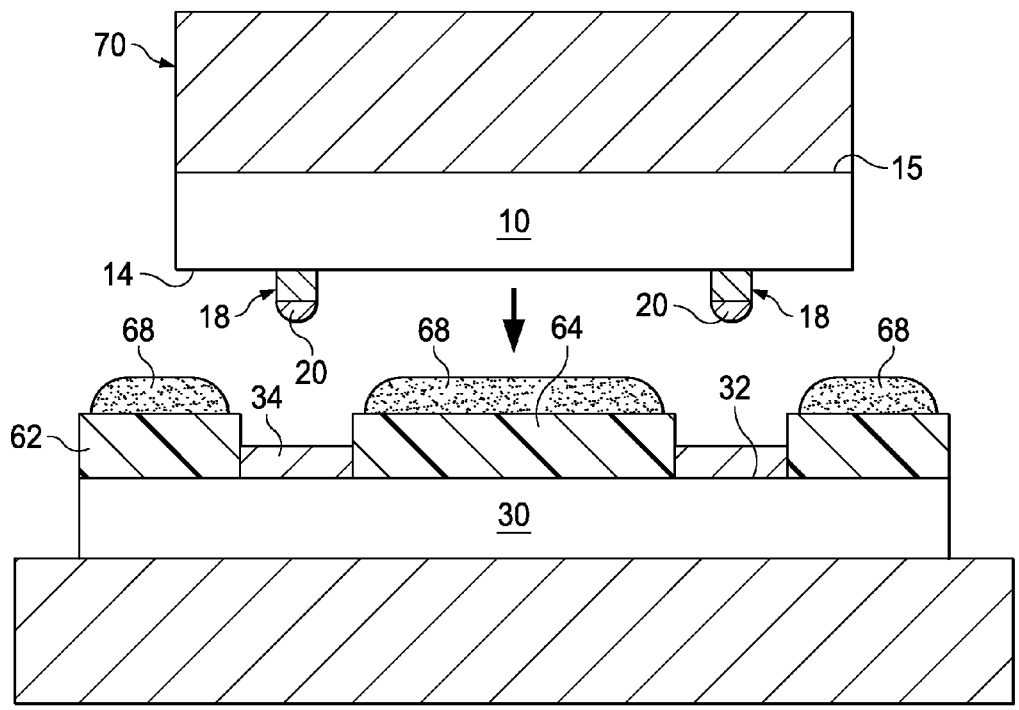
Figure 4C:
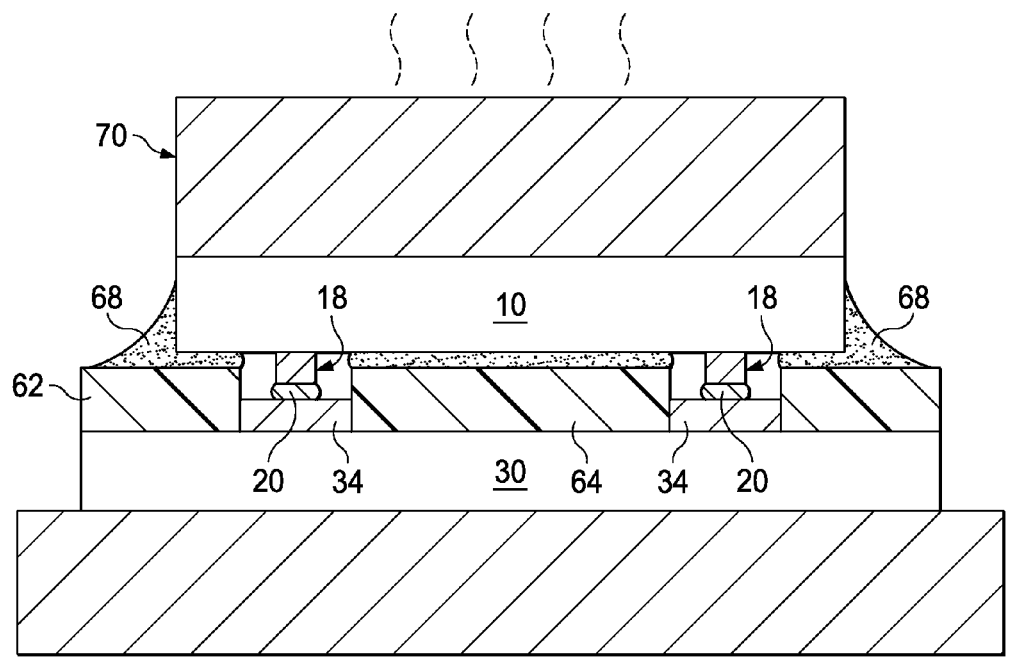
Figure 4D:
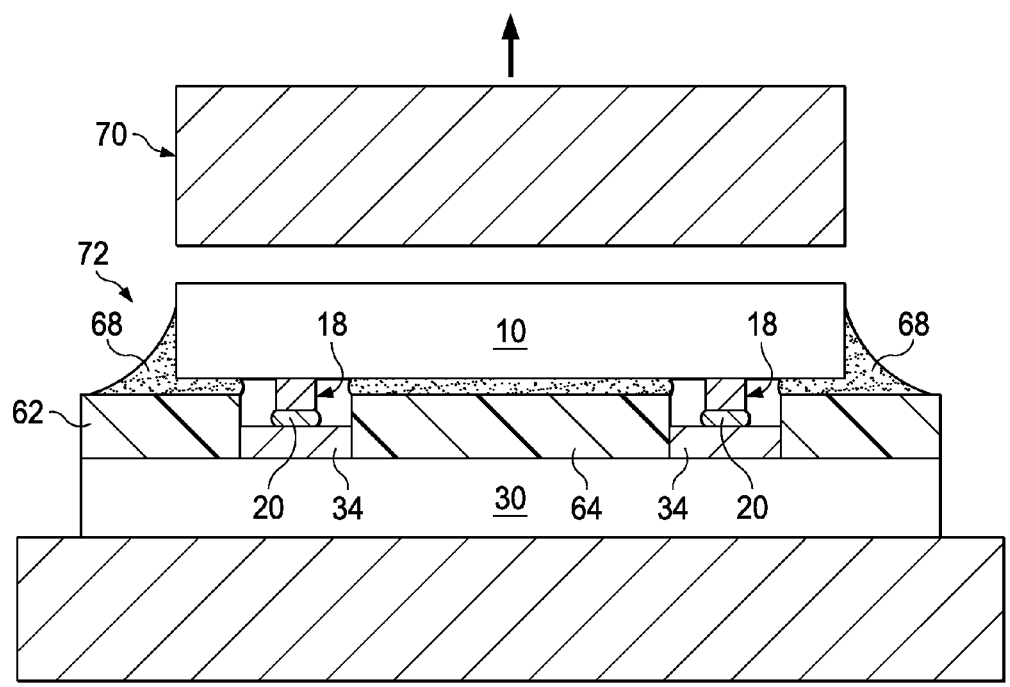

A conventional process by which a flip chip die 10 with copper post connectors 18 is mounted on a substrate 30 is illustrated in FIGS. 4A-4D. Initially, FIG. 4A, a layer of nonconductive paste ("NCP") 68 is deposited on the upper surface of solder resist layers or strips 62, 64 as with a conventional, laterally displaceable NCP dispenser 66. Next, as illustrated in FIG. 4B, a flip chip die 10 with the active face 14 thereof facing downwardly is carried by a die placement and bonding head 70 to a position directly over the substrate 30. The copper post connectors 18 on the die 10 are positioned directly above the target areas 52, 54, 56, 58, FIG. 3, where the copper post connectors 18 are to be attached to the bond fingers 34, 36, 38, 40. Next, FIG. 4C, the placement and bonding head 70 is lowered to position the die 10 in near contact with the top surface of the solder resist strips 62, 64, thereby spreading the nonconductive paste (NCP) 68 across the top surface of the solder resist strips 62, 64. At the same time, the solder tip 20 of each copper post connector 18 comes into contact with the target area, e.g., 52, on an associated bond finger, e.g., 34. The die 10 and substrate 30 are maintained in this position under heat and pressure which causes the individual copper post connectors 18 to bond with the associated bond fingers 34, 36, 38, etc., on the substrate 30. As a final step, the die placement and bonding head 70 is removed leaving a flip chip and substrate assembly 72 that comprises the flip chip die 10 and substrate 30 attached to one another by the solder bonds between the copper post connectors 18 and bond fingers 34, etc. The flip chip die 10 and substrate 30 are also physically bonded by the thin NCP layer between them. This assembly 72 may be a printed circuit (PC) board having a die mounted thereon or an integrated circuit package comprising a flip chip die and substrate assembly, which in some embodiments further comprise a lid over the flip chip die and in some embodiments includes encapsulant covering the flip chip die and substrate. The substrate 30 may also include connectors such as a ball grid array for attaching and electrically connecting the package to other circuitry. Other flip chip and substrate assemblies 72 may include a flip chip and interposer or a flip chip and another type of electrical substrate.

Figure 5:
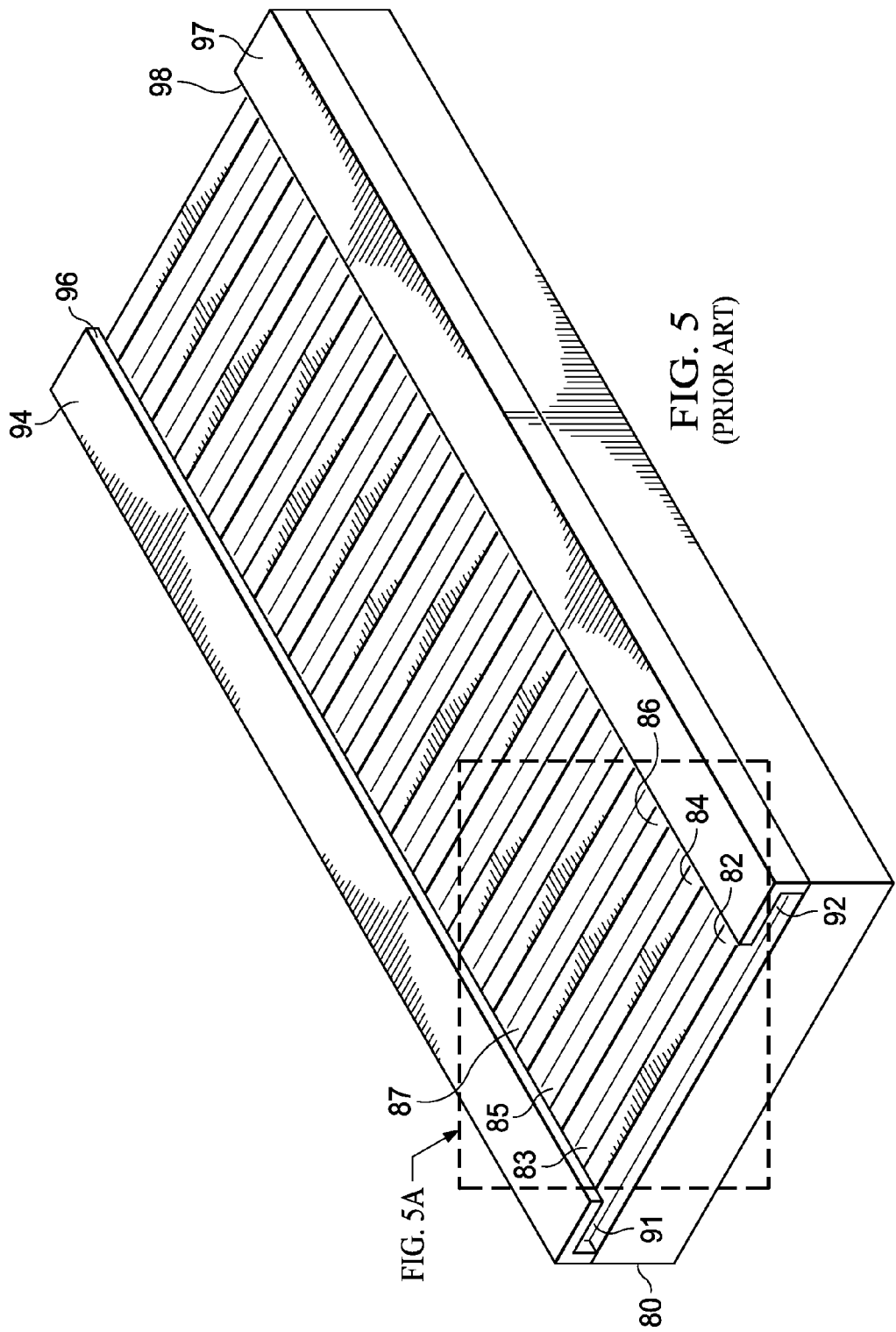
FIG. 5 is a top isometric view of a conventional bond finger array of a substrate.
Figure 5A:
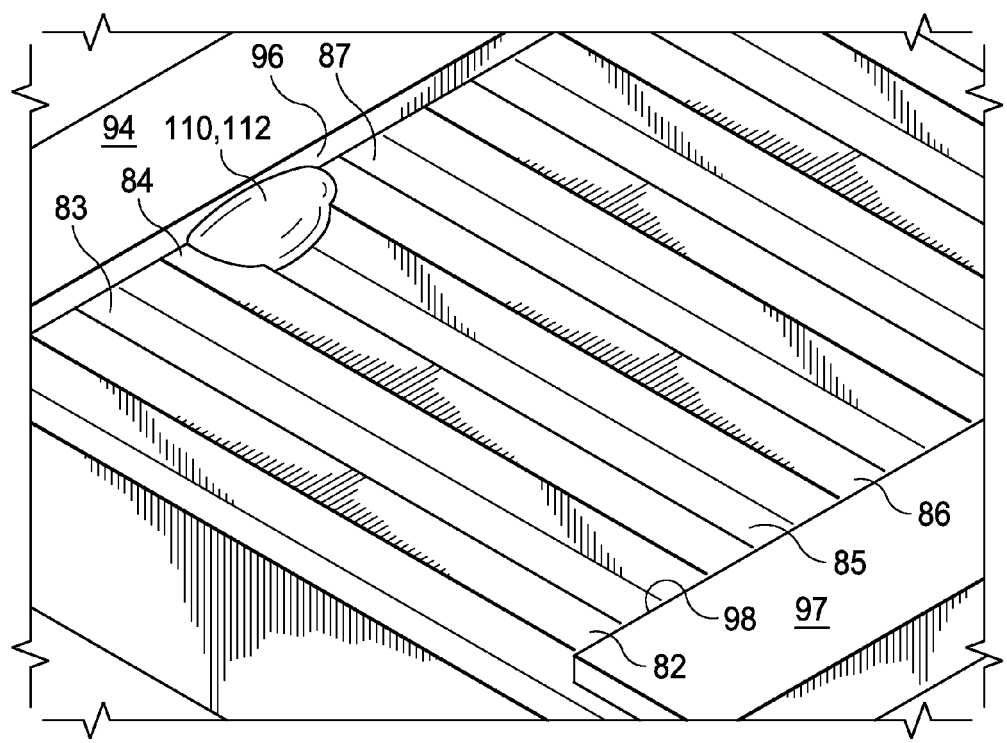
FIG. 5a is a detailed top isometric view of a portion of the bond finger array of FIG. 5 showing a nonconductive paste (NCP) void bridging two bond fingers.

FIGS. 5 and 5A illustrate a portion 80 of a substrate having a plurality of bond fingers 82, 84, 86, etc. Each bond finger has a first end 91 and an opposite second end 92. The first ends 91 of the bond fingers 82, 84, etc. are covered with a first solder resist layer or strip 94 that has a straight inside edge face 96. A second solder resist layer 97 covers the second ends 92 of the bond fingers 82, 84, etc. This second solder resist layer 97 also has a straight edge face 98. As heat and pressure are applied to the die and substrate in the process step shown in FIG. 4(C), the nonconductive paste 68 spreads generally evenly across each solder resist layer 94, 97. However, in some cases, the nonconductive paste may bubble over the edge face 96 of the solder resist layer 94. This bubble or so called "NCP void" 110 may bridge two of the bond fingers, e.g., 84, 86 as illustrated in FIG. 5A. Subsequently, as the solder tip portion 20 of a copper post connector 18 liquefies, it may splatter or otherwise spread to this NCP void 110, which tends to channel the molten solder. The molten solder may thus form a solder bridge 112 which may have generally the same shape as the NCP void 110. Such a solder bridge 112 will cause a short circuit between the adjacent bond fingers 84, 86. As a result, a flip chip assembly 72 that includes the substrate 30 with the short circuit will fail.

FIGS. 6 and 6A illustrate an alternative to the conventional design of FIG. 5 that eliminates or substantially reduces the occurrence of short circuits caused by solder bridging. As illustrated by FIG. 6, a substrate 120 having a plurality of bond fingers 122, 124, 126, 128, 130, with first end portions 132 and opposite second end portions 134, has a plurality of generally evenly spaced gaps 123, 125, 127, 129, etc., between bond fingers. A first solder resist layer or strip 142 is positioned over the first end portions 132 and a second solder resist layer or strip 144 is positioned over the second end portions 134. The edge walls 146, 148 of the solder resist strips 142, 144 are defined by alternating, generally rectangular, longitudinally extending tooth shaped portions 152 (hereinafter, "tooth portions" 152) and generally rectangular gaps 153, which may have the same size and shape of the tooth portions 152. A tooth portion 152 in one nonlimiting embodiment may have a longitudinal dimension of about 40 μm and a width of about 40 μm. As a result of these alternating tooth-shaped portions 152 and gaps 153, any NCP material 114 (sometimes referred to in the art as an NCP "void"), FIG. 6A, that bubbles over the edge wall, e.g., 146, will in most cases end up in a gap 153 and therefore comes into contact with only one bond finger, e.g., 130. Thus, any solder which may follow the NCP material 114 will not result in a short because the solder immediately comes into contact with the solder resist edge wall, e.g., 146 rather than the adjacent bond finger, e.g., 128. Therefore, the solder resist configuration illustrated in FIGS. 6 and 6A prevents or substantially reduces the risk of short circuits caused by bubbles of NCP flowing over the edge walls 146, 148 of the solder resist strips 142, 144. In the embodiment of FIGS. 6 and 6A, each of the tooth portions 152 and gaps 153 defining the edge walls 146, 148 have generally linear edge wall portions 160, 162, 164, 166 that meet at right angle corners, as best shown if FIG. 6A. The more outwardly positioned wall portion 166 is generally where the NCP bubble over occurs because it is nearest to the NCP leading edge 159. This leading edge 159 generally does not extend onto tooth portions 152 because, when the NCP is applied, none is applied on the tooth portions 152.

Figure 7:
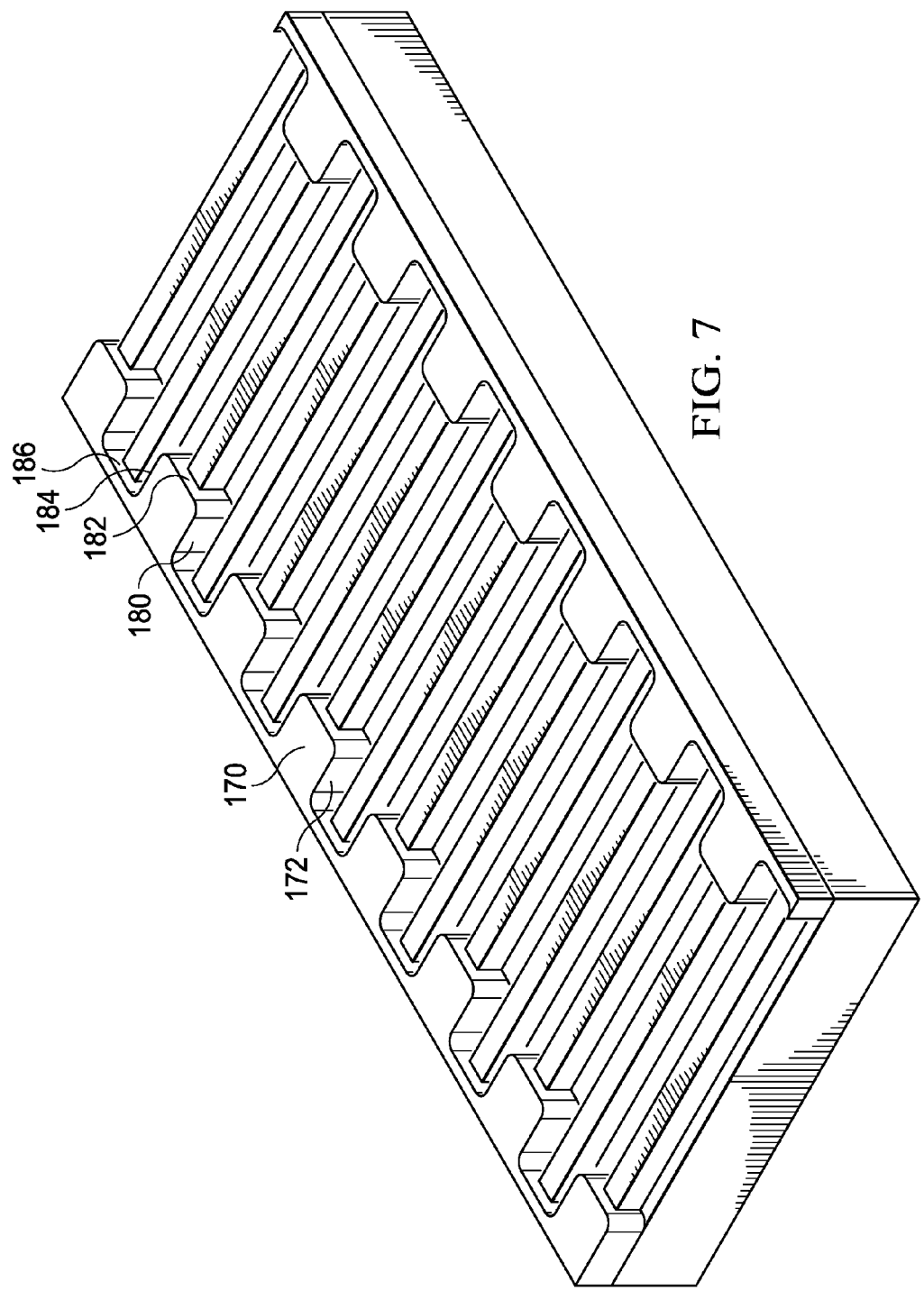
FIG. 7 is a top isometric view of another alternative to the conventional bond finger array of FIG. 5.

In the embodiment illustrated in FIG. 7, the tooth portions 170 and gaps 172, have curved edge wall portions 182, 184, 186, etc. that meet at rounded corners.

Figure 8:
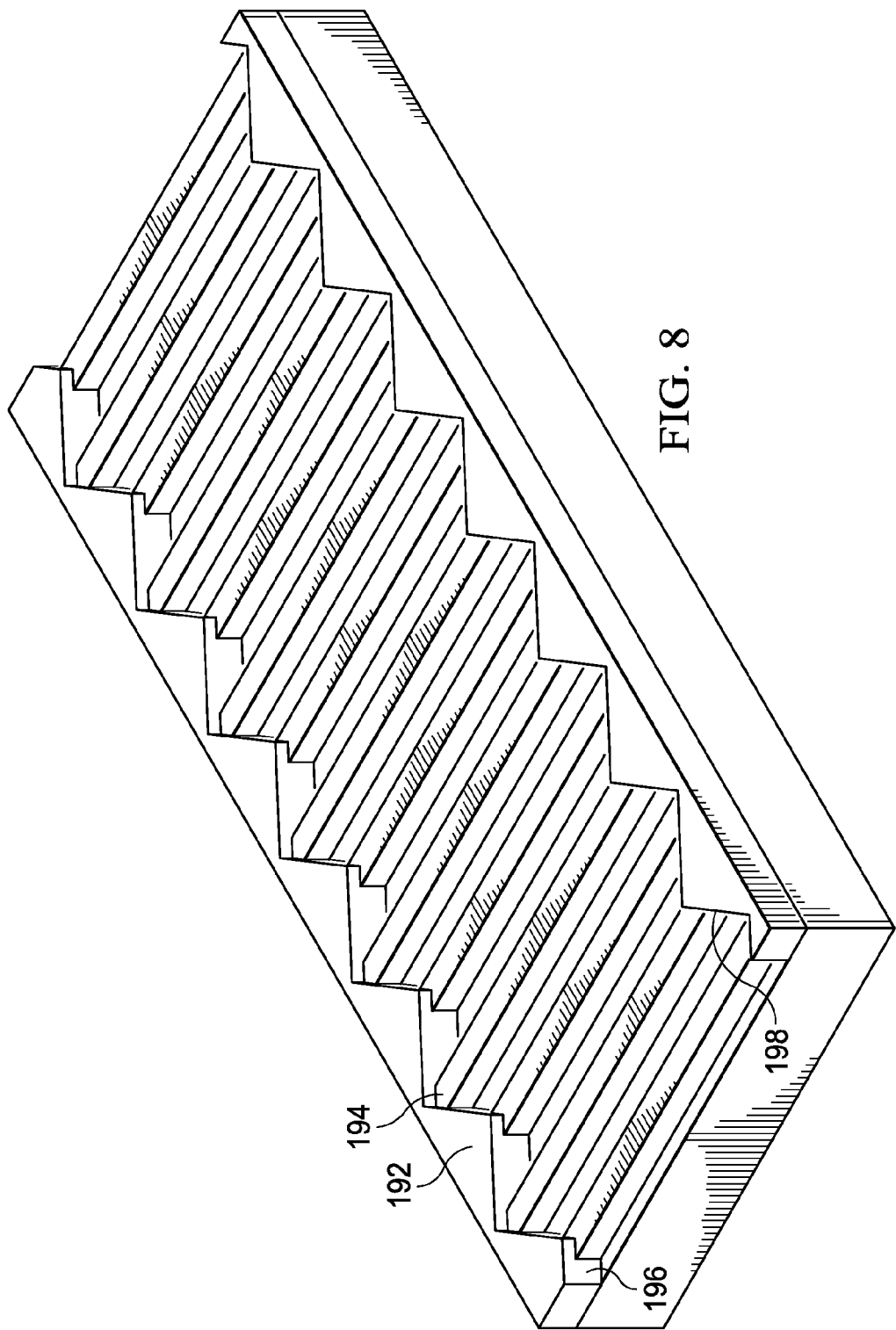
FIG. 8 is a top isometric view of yet another alternative to the conventional bond finger array of FIG. 5.

In another embodiment illustrated in FIG. 8, rather than square teeth, the tooth portions 192 and gaps 194 in the solder resist edge walls 196, 198 are triangular-shaped providing a generally saw tooth shaped edge wall 196, 198. Further resist edge walls with many other geometric shapes could also be provided. Each embodiment that has such an edge wall configuration forms "traps" for any over flowing NCP and following solder that isolates it to a single bond finger, e.g. 128, FIG. 6.

Figure 9:
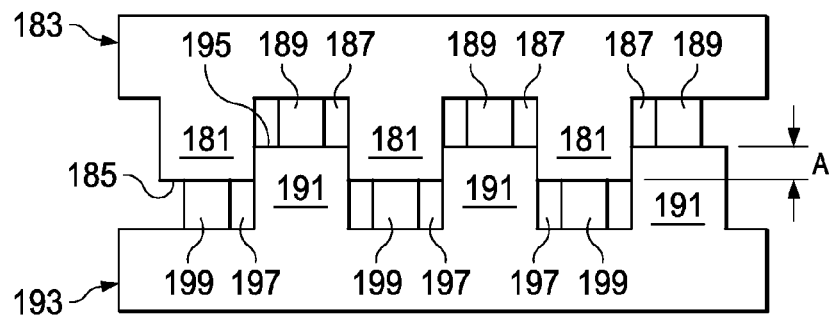
FIG. 9 is a top view of still another alternative to the conventional bond dinger array of FIG. 5.

FIG. 9 illustrates and embodiment in which each tooth portion 181 of a first solder resist strip 183 has a tip portion 185 that overlaps, i.e. is coextensive with the tip portion 195 of adjacent tooth portions 191 in a second solder resist strip 193. In this embodiment each gap 187 associated with the first strip 183 is "capped" by the tip portion 195 of a tooth portion 191 of the second strip 193, and vice verse. In one embodiment the overlap distance A may be at least about 20 μm. Thus, each gap 187 on the first strip 183 and each gap 197 on the second strip 193, except for the gaps at the lateral ends of the strips, is a rectangular enclosure. The portion of each bond finger 189, 199 within each such rectangular enclosure or partial enclosure, e.g., gaps 187, 197, is totally isolated from the adjacent bond fingers.

Solder resist strip edge walls having the various shapes described herein and other shapes may be formed by screen printing the solder resist strips in such shapes. Solder resist screen printing is known in the art.

Figure 10:
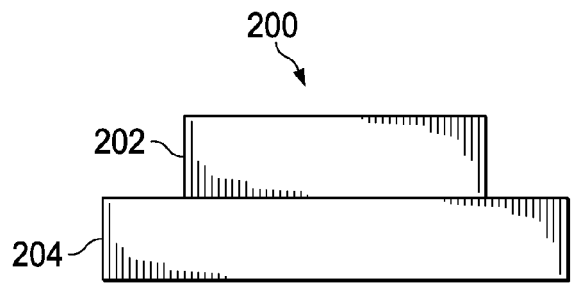
FIG. 10 is a side elevation view of a flip chip assembly having a flip chip mounted on a substrate with a bond finger configuration of the type illustrated in FIG. 6, 7, 8 or 9.

FIG. 10 illustrates a flip chip assembly 200 comprising a flip chip 202 attached to a substrate 204. The flip chip 202 may be a conventional flip chip such as illustrated in FIGS. 1 and 2. The substrate 204 may have bond finger arrays and solder resist layers configured as illustrated in FIG. 6. Alternatively the bond fingers arrays and solder resist layers may be configured as illustrated in FIG. 7 or FIG. 8 or FIG. 9.

Figure 11:
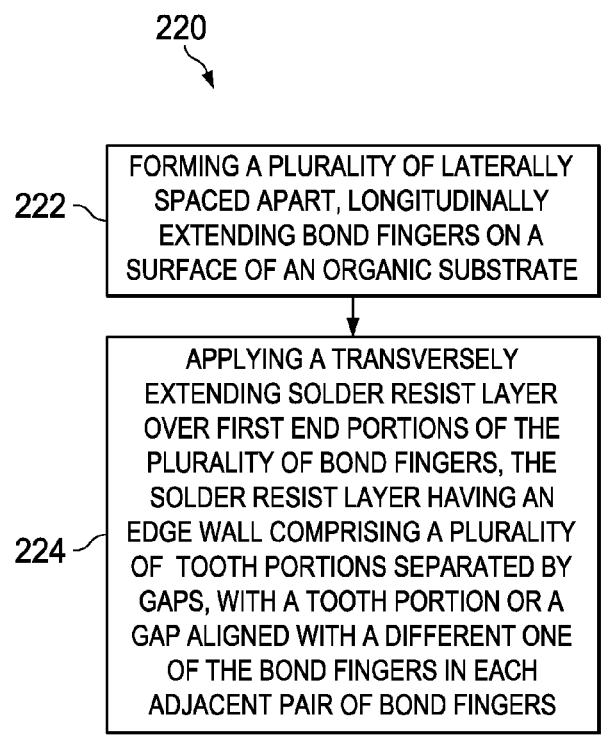
FIG. 11 is a flow chart illustrating one method of making a flip chip assembly.

FIG. 11 illustrates a method 220 of making a flip chip assembly. The method as indicated at 222 includes forming a plurality of laterally spaced apart, longitudinally extending bond fingers on a surface of an organic substrate. The method also includes applying a transversely extending solder resist layer over first end portions of the plurality of bond fingers, the solder resist layer having an edge wall comprising a plurality of generally tooth shaped portions separated by gaps, with a tooth shaped portion or a gap aligned with a different one of the bond fingers in each adjacent pair of bond fingers.

Although certain specific embodiments of a flip chip mounting board and a flip chip assembly and a method of making a flip chip assembly have been described in detail herein, various modification of such apparatus and method will be obvious to persons skilled in the art after reading this disclosure. It is intended that the appended claims be broadly construed so as to encompass such alternative embodiments, except to the extent limited by the prior art.

What is claimed is:

1. A flip chip mounting board comprising:
a substrate having a top surface;
a plurality of generally parallel, longitudinally extending, laterally spaced apart bond fingers formed on said top surface, each of said plurality of bond fingers having a first longitudinal end portion and a second longitudinal end portion; and
a first strip of laterally extending solder resist material overlying said first longitudinal end portions of said bond fingers, said first strip comprising an edge wall having a plurality of longitudinally projecting tooth portions separated by gaps with a longitudinally extending tooth portion being aligned with every other one of said bond fingers whereby adjacent ones of said bond fingers have first end portions covered by different longitudinal lengths of solder resist material.

2. The flip chip mounting board of claim 1 wherein said longitudinally projecting tooth portions have generally straight edged rectangular tooth shapes.

3. The flip chip mounting board of claim 1 wherein said longitudinally projecting tooth portions have generally rounded edged rectangular tooth shapes.

4. The flip chip mounting board of claim 1 wherein said longitudinally projecting tooth portions have generally straight edged triangular tooth shapes.

5. The flip chip mounting board of claim 1, further comprising a second strip of laterally extending solder resist material overlying said second longitudinal end portions of said bond fingers, said second strip comprising an edge wall having a plurality of longitudinally projecting tooth portions separated by gaps that overlies said second end portions of said plurality of bond fingers with a longitudinally extending tooth portion being aligned with every other one of said bond fingers, whereby adjacent ones of said bond fingers have second end portions covered by different longitudinal lengths of solder resist material.

6. The flip chip mounting board of claim 5 wherein tooth portions of said first solder resist strip are aligned with gaps in said edge wall of said second solder resist strip.

7. The flip chip mounting board of claim 5 wherein tooth portions of said first solder resist strip overlap with tooth portions of said second solder resist strip.

8. The flip chip mounting board of claim 1 each longitudinally extending tooth portion of said edge wall having a proximal end, and further comprising a layer of nonconductive paste (NCP) overlying said first strip of solder resist material except for said longitudinally projecting tooth portions thereof whereby overrun from said NCP layer onto said plurality of bond fingers is substantially confined to portions of said bond fingers located in said gaps between said tooth portions.

9. A flip chip assembly comprising:
a flip chip mounting board comprising:
a substrate having a top surface;
a plurality of generally parallel, longitudinally extending, laterally spaced apart bond fingers formed on said top surface, each of said plurality of bond finger having a first longitudinal end portion and a second longitudinal end portion;
a first strip of laterally extending solder resist material overlying said first longitudinal end portions of said bond fingers, said first strip comprising an edge wall having a plurality of longitudinally projecting tooth portions separated by gaps, with a longitudinally extending tooth portion being aligned with every other one of said bond fingers, whereby adjacent ones of said bond fingers have first end portions covered by different longitudinal lengths of solder resist material; and a flip chip die having a plurality of solder tipped copper pillar conductors mounted on said flip chip mounting board with said plurality of solder tipped copper pillar conductors bonded to said bond fingers on said flip chip mounting board.

10. The flip chip assembly of claim 9 wherein said flip chip mounting board comprises one of an interposer and a chip carrier.

11. The flip chip assembly of claim 9 wherein said flip chip mounting board comprises a printed circuit board.

\* \* \* \* \*